(12) United States Patent
Shih et al.

(10) Patent No.: US 7,098,722 B2
(45) Date of Patent: Aug. 29, 2006

(54) LOW POWER DESIGN FOR FUSE CONTROL CIRCUIT

(75) Inventors: Jeng-Tzong Shih, Hsinchu (TW); Bor-Doou Rong, Chupei (TW)

(73) Assignee: Etron Technology, Inc., Hsin-Chu (TW)

( * ) Notice: Subject to any disclaimer, the term of this patent is extended or adjusted under 35 U.S.C. 154(b) by 31 days.

(21) Appl. No.: 10/889,910

(22) Filed: Jul. 13, 2004

(65) Prior Publication Data

US 2006/0012418 A1    Jan. 19, 2006

(51) Int. Cl.
    *H01H 85/00*    (2006.01)
(52) U.S. Cl. ...................... 327/525; 327/523
(58) Field of Classification Search ............... 327/525, 327/526
    See application file for complete search history.

(56) References Cited

U.S. PATENT DOCUMENTS

| | | | |
|---|---|---|---|
| 5,345,110 A * | 9/1994 | Renfro et al. | 327/199 |
| 5,929,691 A * | 7/1999 | Kim et al. | 327/525 |
| 6,073,258 A | 6/2000 | Wheater | 714/718 |
| 6,128,234 A * | 10/2000 | Akita et al. | 365/200 |
| 6,225,820 B1 * | 5/2001 | Kim et al. | 326/34 |
| 6,236,599 B1 * | 5/2001 | Goto | 365/194 |
| 6,268,760 B1 * | 7/2001 | Marshall et al. | 327/525 |
| 6,292,422 B1 | 9/2001 | Pitts | 365/225.7 |
| 6,545,526 B1 * | 4/2003 | Honigschmid | 327/525 |
| 6,545,527 B1 * | 4/2003 | Moreaux | 327/525 |
| 6,919,754 B1 * | 7/2005 | Kuroki | 327/525 |
| 2005/0052218 A1 * | 3/2005 | Killian et al. | 327/525 |
| 2005/0146373 A1 * | 7/2005 | Yoon | 327/525 |

OTHER PUBLICATIONS

"An Ultralow Power 8Kx8-Bit Full CMOS RAM with a Six-Transistor Cell," by Kiyofumi Ochii et al., IEEE Journal of Solid-State Circuits, vol. SC-17, No. 5, Oct. 1982, pp. 798-803.

* cited by examiner

*Primary Examiner*—Terry D. Cunningham
(74) *Attorney, Agent, or Firm*—Saile Ackerman LLC; Stephen B. Ackerman (57) ABSTRACT

A blocking section is inserted between the control section and the fuse section of a fuse control logic circuit. The blocking section comprises switching means which block the flow of DC current during a power-up sequence and thus avoids the collapse of the power supply voltage with the attending potential for incorrect addressing and improper function and timing options. The insertion of the blocking section further eliminates indeterminate logic states when fusible means are not fully blown thus assuring correct voltage levels at the output of the circuit.

12 Claims, 6 Drawing Sheets

LOW POWER DESIGN FOR FUSE CONTROL CIRCUIT

BACKGROUND OF THE INVENTION

1. Field of the Invention

The invention relates to an address matching circuit for redundancy cell repair in DRAM memories, and more particularly to such a circuit which is without a DC path at power up and one which has a better margin when the fuse in the circuit is only partially blown.

2. Description of the Related Art

Figure 1A:
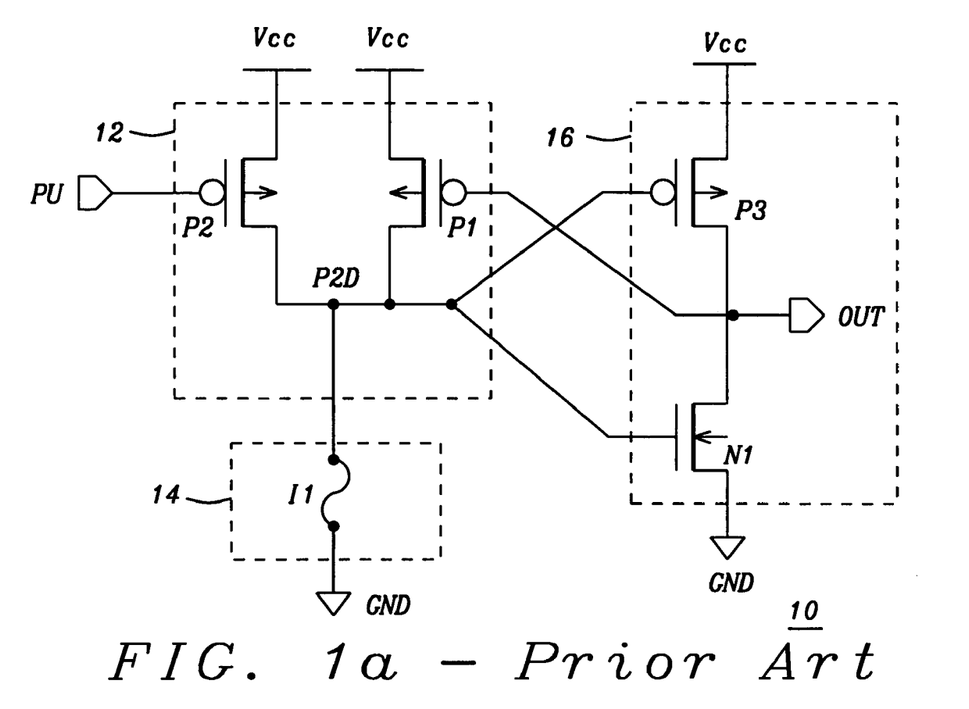
FIGS. 1a and 1b are circuit diagrams of the prior art.

Referring now to FIG. 1a a conventional fuse control logic circuit 10 is shown. Power-up signal PU is the input to control section 12 and couples to the gate of PMOS transistor P2. Transistors P1 and P2 are coupled in parallel between a power supply $V_{CC}$ and a common node P2D. The fuse section 14 with fuse I1 is coupled between P2D and the return terminal of power supply $V_{CC}$ (ground in FIG. 1a). The common node P2D couples to the gates of PMOS transistor P3 and NMOS transistor N1 of driver section 16. Transistors P3 and N1 are coupled in series between $V_{CC}$ and the return terminal of power supply $V_{CC}$ (ground). The junction between transistors P3 and N1 is the output terminal OUT of driver section 16. The output terminal OUT also feeds back to the gate of PMOS transistor P1.

The problem with the related art of FIG. 1a is that it has a DC path when PU=0 (logical "0"), which is the power-up state. This will introduce potential problems such as excessive current drain if there are many of these circuits, especially when the driving capability of the power supply is not enough. An additional problem is that the related art circuit has a smaller margin for normal function if fuse I1 is not perfectly blown because transistor P2 represents a large resistor for a small DC current. Common node P2D will then be at some intermediate voltage level depending on the resistance of fuse I1. As a result the circuit may malfunction because the voltage at common node P2D is not high enough. Additionally, there may be DC current flowing through transistors P3/N1. This is a serious problem for low power memories which may be out-of-spec then.

Figure 1B:
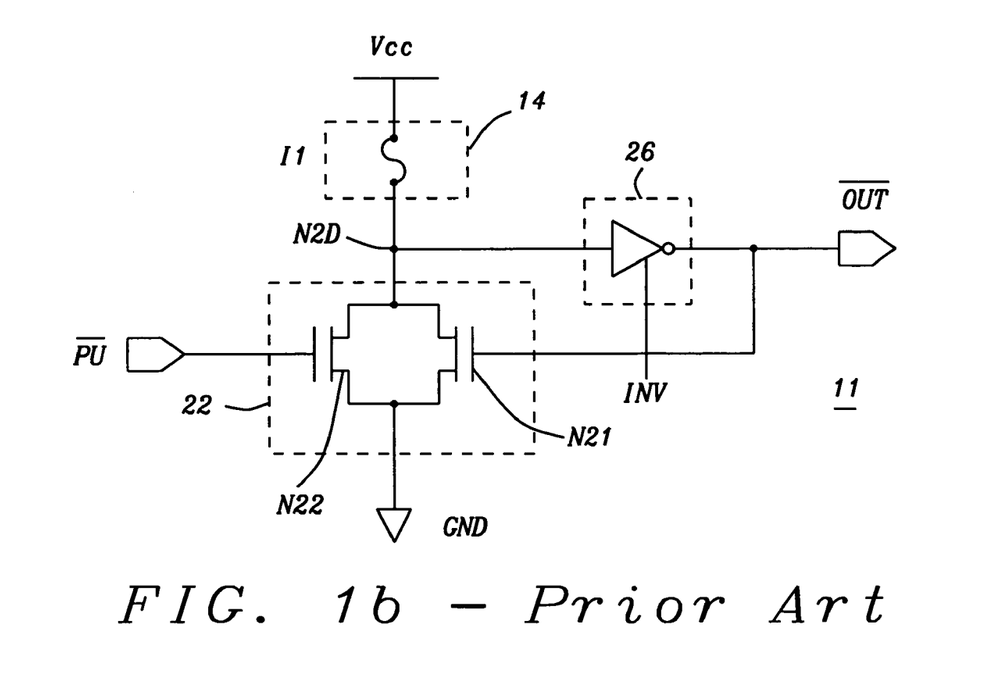

The related art circuit 11 of FIG. 1b is structurally similar to circuit 10 of FIG. 1a but uses NMOS transistors. Fuse section Block 14 is coupled between power supply $V_{CC}$ and node N2D. Block 22, coupled between node N2D and ground comprises transistors N21 and N22. The first input of Block 22 receives power-up signal PU-bar, which is the inverted signal of PU of circuit 10, Block 12. Block 26, showing a generic inverter INV, is coupled between node N2D and the second input to Block 22. The description for FIG. 1a above applies equally to circuit 11 of FIG. 1b.

Figure 2:
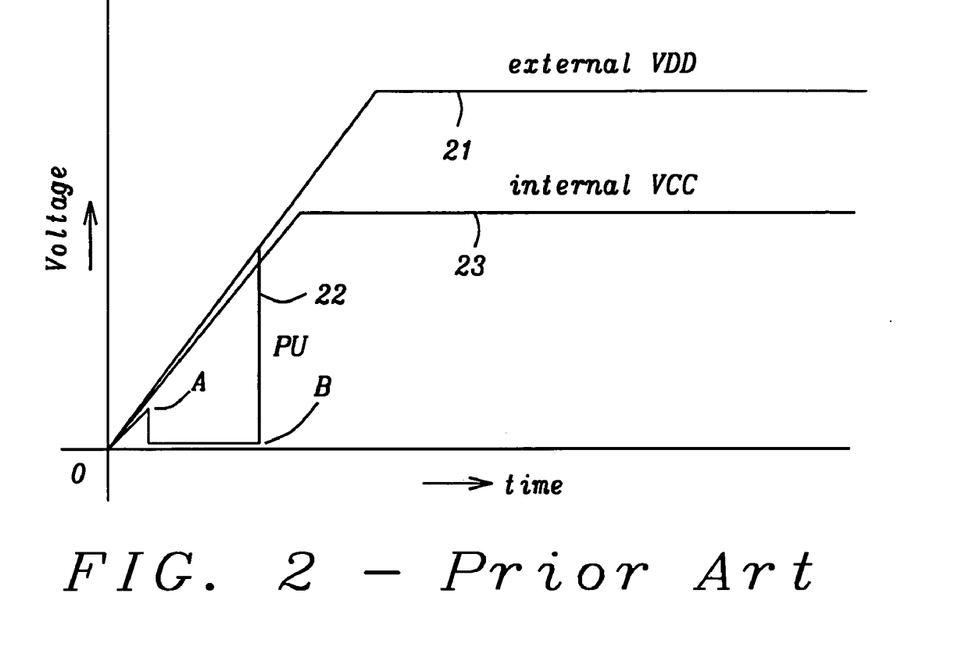
FIG. 2 is a view of the input signal and voltage levels of a good power supply or regulator of the circuit of FIG. 1.

FIG. 2 is a graph of the input signal and the voltage levels of a good power supply or regulator during power-up of the circuit of FIG. 1. Curve 21 depicts the external $V_{DD}$ supply ramping up, Curve 22 depicts the power-up signal PU ramping up briefly to Point A, dropping to "0" level, and then rising at Point B to join Curve 21. Curve 23 depicts the internal $V_{CC}$ supply ramping up smoothly.

Figure 3:
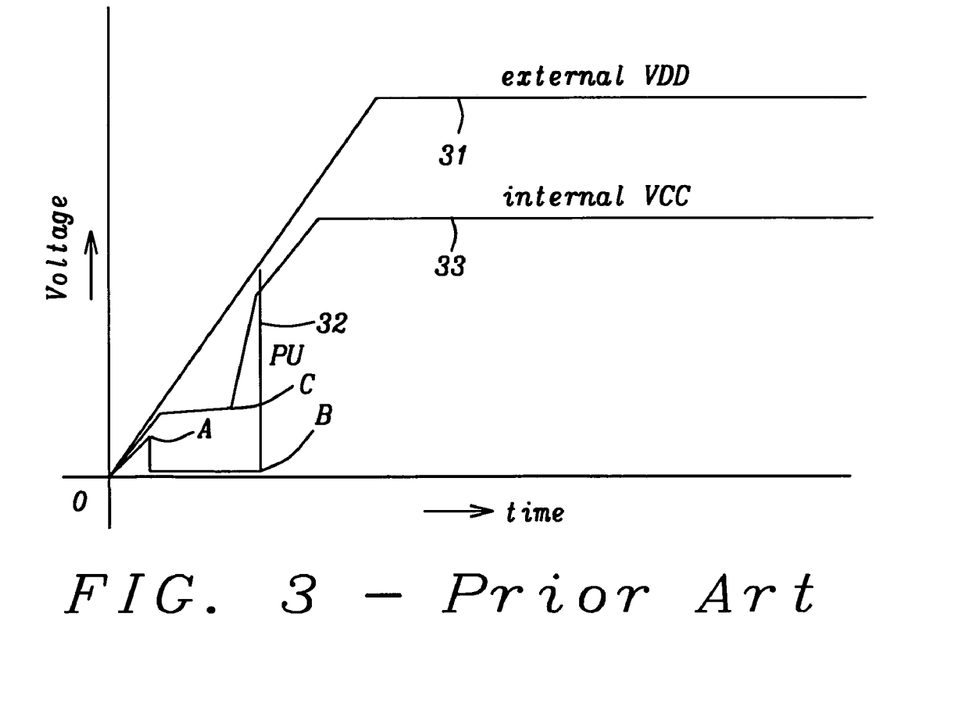
FIG. 3 is a view of the input signal and voltage levels of a bad power supply or regulator of the circuit of FIG. 1.

FIG. 3 is a graph of the input signal and voltage levels of a bad power supply or regulator of the circuit of FIG. 1. Curves 31 and 32 are identical to Curves 21 and 22 of FIG. 2. Internal $V_{CC}$ Curve 33, however, ramps up only to about Point A, then continues almost horizontally to Point C and then rises. The section from near Point A to Point C represents an excessive current draw caused by DC paths in the P2/I1 path in other circuits without blown fuses. This delay in the rise of the internal $V_{CC}$ supply causes problems when the blown-fuse initialization time is not long enough, because then common node P2D cannot set up properly at startup and its voltage level is at an indeterminate state. An improper address may be output or an improper function/timing option may be selected. Conversely, if the initialization time is lengthened it affects other circuits which use the power-up signal PU and $V_{CC}$ for initialization. Lastly, in blown fuse circuits a DC current path can be introduced in the P3/N1 transistor path because P2D is neither at "0" nor at "1".

An improved circuit and method are clearly needed to overcome these problems of the related art. The circuits and method described hereinafter and illustrated in FIGS. 4a, 4b, 5a, 5b, and 6 completely eliminates these problems.

U.S. Pat. No. 6,292,422 (Pitts) discloses a system and method for storing data values by implementation of electrical fuse chains which enables the programming and use of electrical fuses and includes read and write protection. U.S. Pat. No. 6,073,258 (Wheater) teaches the use of fuse elements responsible for soft-fusing redundant memory elements into the memory array. Soft-fusing is defined to mean that the fuse elements may be set and reset via an electronic signal.

It should be noted that none of the above-cited examples of the related art address the above described problems.

SUMMARY OF THE INVENTION

It is an object of at least one embodiment of the present invention to provide circuits and a method which block any DC paths on power-up and therefore eliminate a potential collapse of the power supply voltage.

It is another object of the present invention to prevent the fuse control logic circuit from entering into an indeterminate state by providing a circuit which is more tolerant of a residual fuse resistance, thereby allowing normal function when the fusible means is not fully destroyed.

It is yet another object of the present invention is to prevent an indeterminate and improper address at the output of the circuit.

It is still another object of the present invention is to prevent the selection of an improper function or timing option.

It is a further object of the present invention to provide a fuse control logic circuit for a fail address matching circuit for redundancy cell repair in a memory.

It is yet a further object of the present invention to provide a fuse control logic circuit for use in certain functions on a die per customer request.

It is still a further object of the present invention is to provide a fuse control logic circuit for timing options such as to adjust timing parameters.

These and other objects have been achieved by inserting a blocking section between the control section and the fuse section, where the blocking section comprises switching means which block the flow of DC current during a power-up sequence and thus avoids the collapse of the power supply voltage with attending serious side effects. The insertion of the blocking section further assures proper voltage levels at the output of the circuit.

These objects and advantages of the present invention will be readily apparent to one skilled in the art to which the invention pertains from a perusal of the claims, the appended drawings, and the following detailed description of the preferred embodiments.

In the following, first and second conductivity types are opposite conductivity types, such as N and P types. Each embodiment includes its complement as well.

BRIEF DESCRIPTION OF THE DRAWINGS

Use of the same reference number in different figures indicates similar or like elements.

DESCRIPTION OF THE PREFERRED EMBODIMENT

Figure 4A:
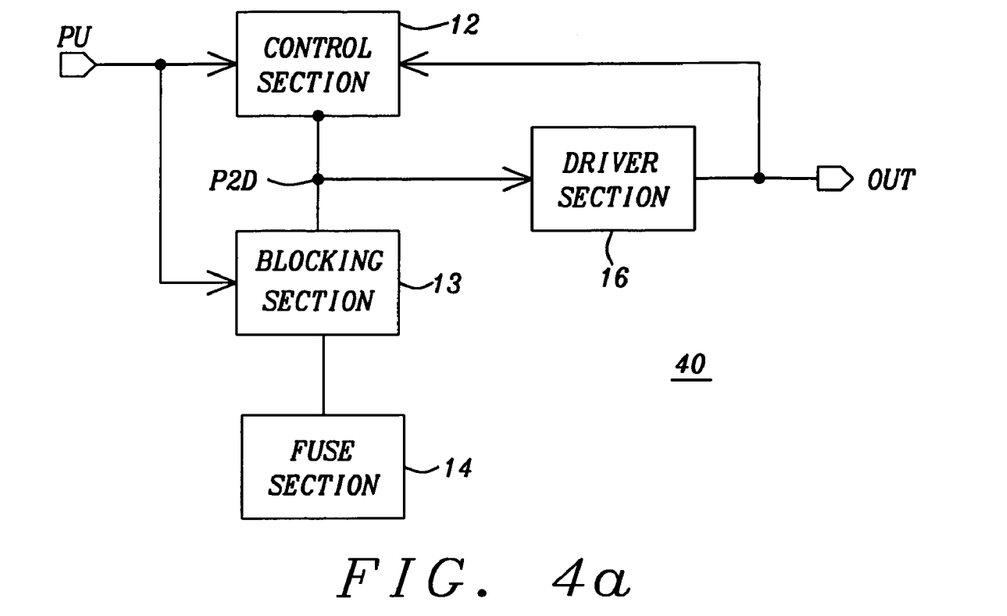
FIGS. 4a and 4b are block diagrams of a first and second preferred embodiment of the present invention.

Referring now to FIG. 4a, we begin a description of a first preferred embodiment of the present invention. FIG. 4a is a block diagram of fuse control logic circuit 40 comprising control section 12, a blocking section 13 coupled to common node P2D of control section 12, a fuse section 14 coupled to blocking section 13, and a driver section 16 coupled to common node P2D. Control section 12 and blocking section 13 share a first input with power-up signal PU applied. The output terminal OUT of driver section 16 feeds back to a second input of control section 12.

Figure 5A:
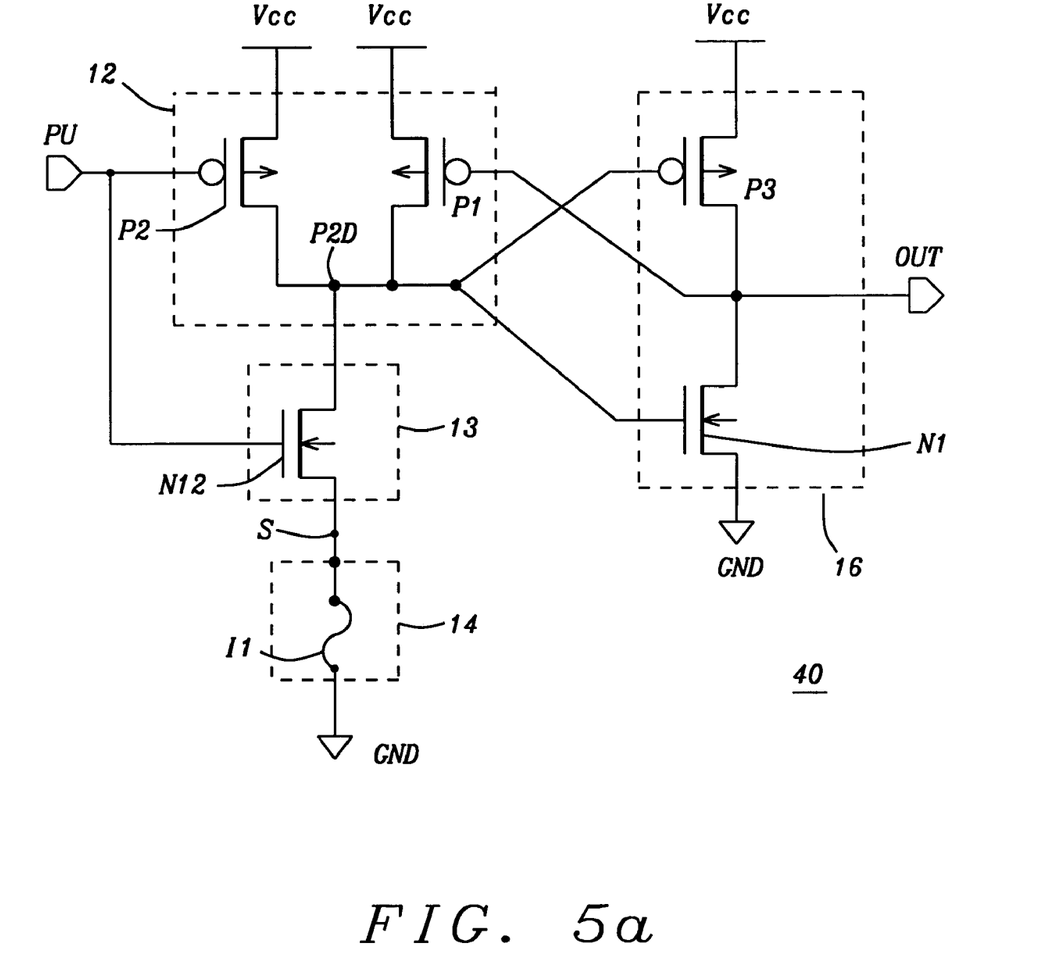
FIGS. 5a and 5b are circuit diagrams of a first and second preferred embodiment of the present invention.

Referring now to FIG. 5a we describe in detail fuse control logic circuit 40. First input receives a power-up signal PU which has a logical "0" or "1". Control section 12 comprises switching means which are coupled at one end to common node P2D. Control section 12 controls the state of fuse control logic circuit 40 as a function of the first input. Blocking section 13, comprising switching means, blocks DC paths in the control section when the power-up signal PU is at a logical "0". Fuse section 14 comprises fusible means and controls the voltage level at the output terminal S of blocking section 13. Driver section 16, coupled to the common node P2D, has an output terminal OUT. Driver section 16 serves as a signal powering means and is illustrated here, by way of example, as a CMOS inverter. Output terminal OUT is coupled to a second input of control section 12. When power-up signal PU is at logical "1", output terminal OUT produces a logical "1" signal when the fusible means of fuse section 14 is not blown, and a logical "0" signal when the fusible means is blown.

Control section 12 has a first input, receiving power-up signal PU, a second input and a common node P2D. The first input is coupled to the control gate of first switching means P2, the second input is coupled to the control gate of second switching means P1. First terminals of switching means P1, P2 are coupled to the positive terminal of a power supply $V_{CC}$, while the second terminals of second switching means P1, P2 are tied to common node P2D. Switching means P1 and P2 are shown as PMOS transistors by way of illustration.

Blocking section 13 comprises a third switching means N12 having a first terminal and a second terminal S, and a control gate. The first terminal of third switching means N12 is coupled to common node P2D, and the control gate of N12 is coupled to the first input of control section 12. The function of blocking section 13 is to block DC paths in control section 12 during a power-up sequence when power-up signal PU is inactive (logical "0"). Switching means N12 is shown as an NMOS transistor by way of illustration and of opposite conductivity to P1, P2. When power-up signal PU is active (logical "1"=near $V_{CC}$), blocking section 13 insures that common node P2D is at or near ground level (because NMOS transistor N12 is conducting) when fusible means I1 is good, thus providing a logical "1" at output terminal OUT. When the power-up signal PU is inactive (logical "0") PMOS transistor P2 is conducting. This forces node P2D to near $V_{CC}$ and the output terminal OUT to a logical "0" (near GND), whether fusible means I1 is good (not blown) or blown.

Fuse section 14 comprises fusible means I1, where one end of that fusible means I1 is coupled to the second terminal S of third switching means N12. The other end of fusible means I1 is coupled to the return terminal of the power supply (typically ground GND). Fuse section 14 controls the voltage level at second terminal S of third switching means N12.

Driver section 16 comprises a fourth and a fifth switching means P3, N1, coupled in series between the positive terminal of the power supply $V_{CC}$ and the return terminal of that power supply (typically ground GND). The control gates of the fourth and the fifth switching means are coupled to common node P2D of the control section 12. The junction of the fourth and fifth switching means is coupled to output terminal OUT, and also to the control gate of the second switching means P1, thereby latching up fuse control logic circuit 40. When power-up signal PU is at logical "1", CMOS driver section 16 provides a logical "1" (near $V_{CC}$) signal at output terminal OUT when fusible means I1 is not blown and a logical "0" signal (near ground) when it is blown or not fully blown. Fourth and fifth switching means P3, N1 illustrate a typical inverter in CMOS technology but may be replaced by some other suitable inverter means.

The present invention provides a circuit which is more tolerant of a residual fuse resistance when the fusible means I1 is not fully blown, i.e. it has some resistance instead of presenting an open circuit. This is because the width-to-length ratio (W/L) of P1 can be much larger than the W/L of P2 and is not critical in the present invention. The ratio is typically 10:1, but may range, depending on the design, from 20:1 to 5:1. When the ratio is 10:1 the tolerance of the residual resistance is about one tenth of the prior art for normal function. In the present invention, the W/L of P1 is key since it must be large enough to overcome leakage current when the fuse is not blown properly. In the prior art, the W/L of P1 and P2 is important; in particular the W/L of P2 must be small for a small DC current during the power-up period. In the present invention, the W/L of N12 must be larger than the W/L of P1 and is typically 5:1 but may range, depending on the design, from 10:1 to 2:1.

Figure 4B:
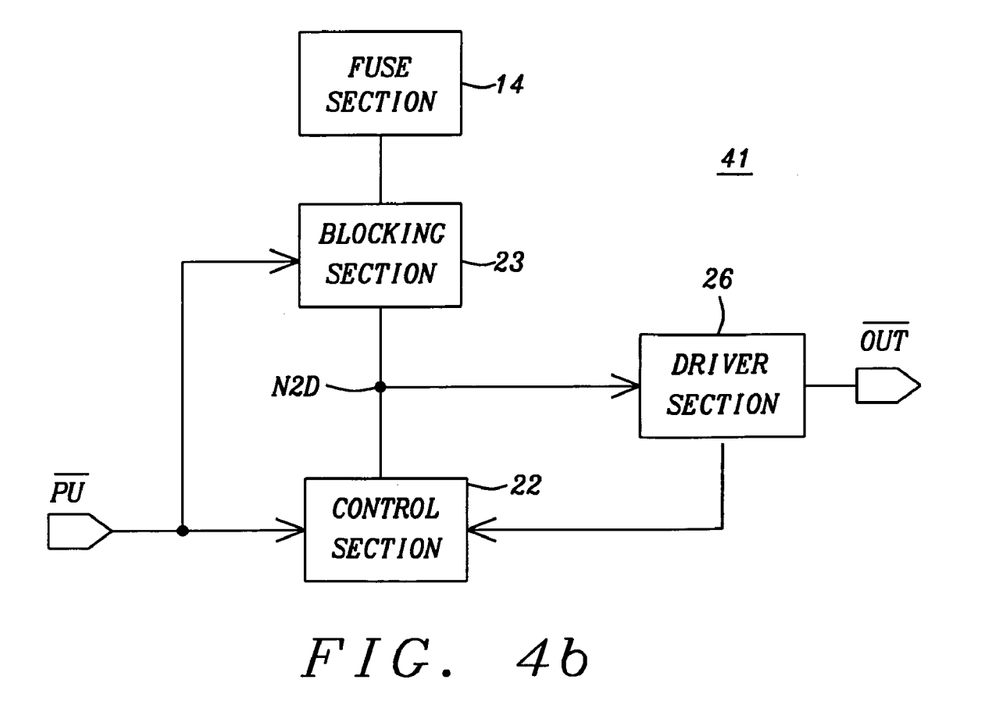

In a second preferred embodiment the NMOS and PMOS transistors are interchanged. This requires that the blocks of FIG. 4a are rearranged as illustrated by circuit 41 in FIG. 4b and that the polarity of the power-up signal PU of FIG. 4a be inverted as is obvious to those skilled in the art. Still referring to FIG. 4b, the block diagram of fuse control logic circuit 41 comprises control section 22, a blocking section 23 coupled to common node N2D of control section 22, a fuse section 14 coupled to blocking section 23, and a driver section 26 coupled to common node N2D. Control section 22 and blocking section 23 share a first input power-up signal PU-bar (NOT PU). The output terminal OUT-bar (=NOT OUT) of driver section 26 feeds back to a second input of control section 22. Note that the function of Blocks 22 and 12, 23 and 13, 26 and 16 of FIGS. 4b and 4a, respectively, are the same. Note also that negative logic is used in the second preferred embodiment, so that:

a signal is active when it is near ground potential (=logical "1");

a signal is inactive when it is near $V_{CC}$ (=logical "0").

Figure 5B:
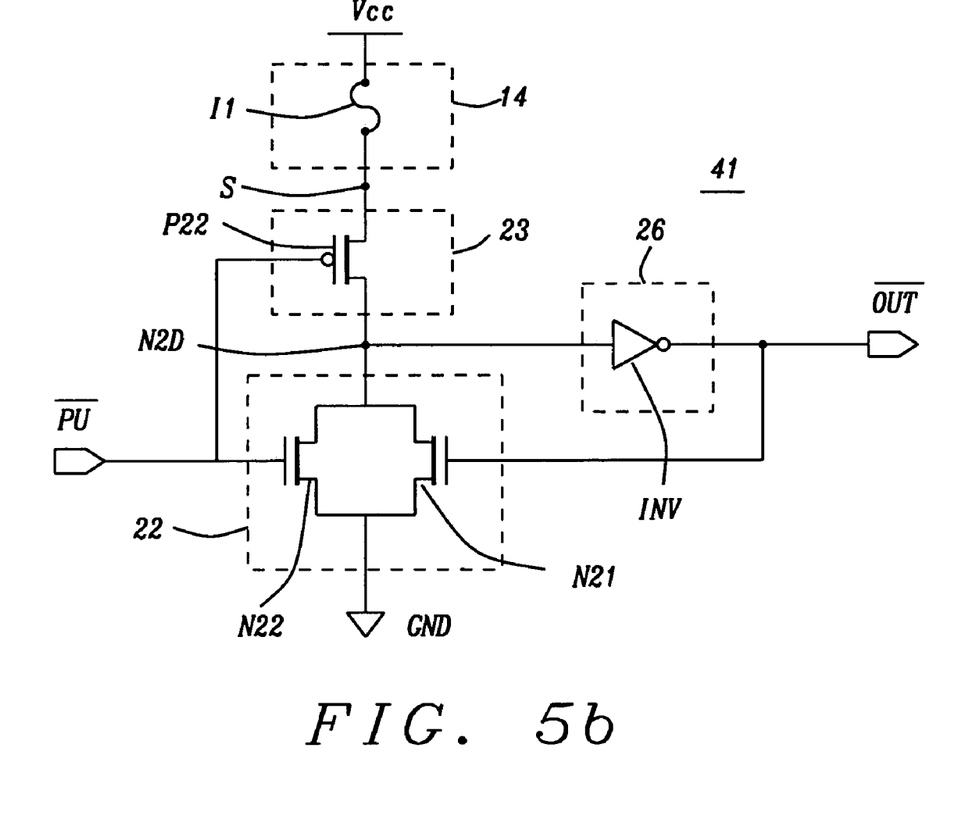

We now refer to FIG. 5b for an explanation of the fuse control logic circuit 41 of the second preferred embodiment of the present invention. Control section 22 comprises switching means which are coupled at one end to common node N2D. Control section 22 controls the state of fuse control logic circuit 41 as a function of the first input. Blocking section 23, comprising switching means, blocks DC paths in the control section when the power-up signal is at a logical "1". Fuse section 14 comprises fusible means and controls the voltage level at the output terminal S of blocking section 23. Driver section 26, coupled to the common node N2D, has an output terminal OUT-bar. Driver section 26 serves as a signal powering means and is illustrated here, by way of example, as inverter INV. Output terminal OUT-bar is coupled to a second input of control section 22. When power-up signal PU-bar is at logical "1", output terminal OUT-bar produces a logical "1" signal when the fusible means of fuss section 14 is not blown, and a logical "0" signal when the fusible means is blown or not fully blown. The detailed explanation of fuse control logic circuit 41 is obvious to those skilled in the art by referring to circuit 40 of FIG. 5a and reviewing the explanation of control section 12, blocking section 13, and fuse section 14.

Still referring to FIG. 5b, control section 22 has a first input receiving power-up signal PU-bar, a second input and a common node N2D. The first input is coupled to the control gate of first switching means N22, the second input is coupled to the control gate of second switching means N21. First terminals of switching means N21, N22 are coupled to the return terminal of a power supply (typically ground GND), while the second terminals of N21 and N22 are tied to common node N2D. N21 and N22 are shown as NMOS transistors by way of illustration.

Blocking section 23 comprises a third switching means P22 having a first terminal and a second terminal S, and a control gate. The first terminal of third switching means P22 is coupled to common node N2D, and the control gate of P22 is coupled to the first input of control section 22. The function of blocking section 23 is to block DC paths in control section 22 during a power-up sequence when power-up signal PU-bar is inactive (logical "0"). Switching means P22 is shown as an PMOS transistor by way of illustration and of opposite conductivity type to N21, N22. When power-up signal PU-bar is active (logical "1"=near ground), blocking section 23 insures that common node N2D is pulled up to or near $V_{CC}$, when fusible means I1 is good, thus providing a logical "1" (near ground) at output terminal OUT-bar. When the power-up signal PU-bar is inactive (logical "0"=near $V_{CC}$) PMOS transistor P22 is off, but NMOS transistor N22 is conducting, thus pulling node N2D to ground. Thus the output terminal OUT-bar is set to a logical "0" (near $V_{CC}$), whether fusible means I1 is good (not blown) or blown. However, when PU-bar is active and when fusible means I1 is not fully blown then terminal OUT is forced to logical "0".

Fuse section 14 comprises fusible means I1, where one end of that fusible means I1 is coupled to the second terminal S of third switching means P22. The other end of fusible means I1 is coupled to the positive terminal of the power supply $V_{CC}$. Fuse section 14 controls the voltage level at second terminal S of third switching means P22.

Driver section 26 comprises an inverter INV, whose input is coupled to node N2D and whose output is coupled to output terminal OUT-bar and the control gate of the second switching means N21, thereby latching up fuse control logic circuit 41. When first input, receiving power-up signal PU-bar, is at logical "1", i.e. low, inverter INV provides a logical "1" signal, i.e. low, at output terminal OUT-bar when fusible means I1 is not blown and a logical "0" signal, i.e. high, when it is blown or not fully blown, as already mentioned earlier.

In the second preferred embodiment the W/L ratios for N21, N22 are the same as those of P1, P2 of the first preferred embodiment. However, the W/L of P22 versus N21 of the second preferred embodiment ranges from 20:1 to 4:1.

Figure 6:
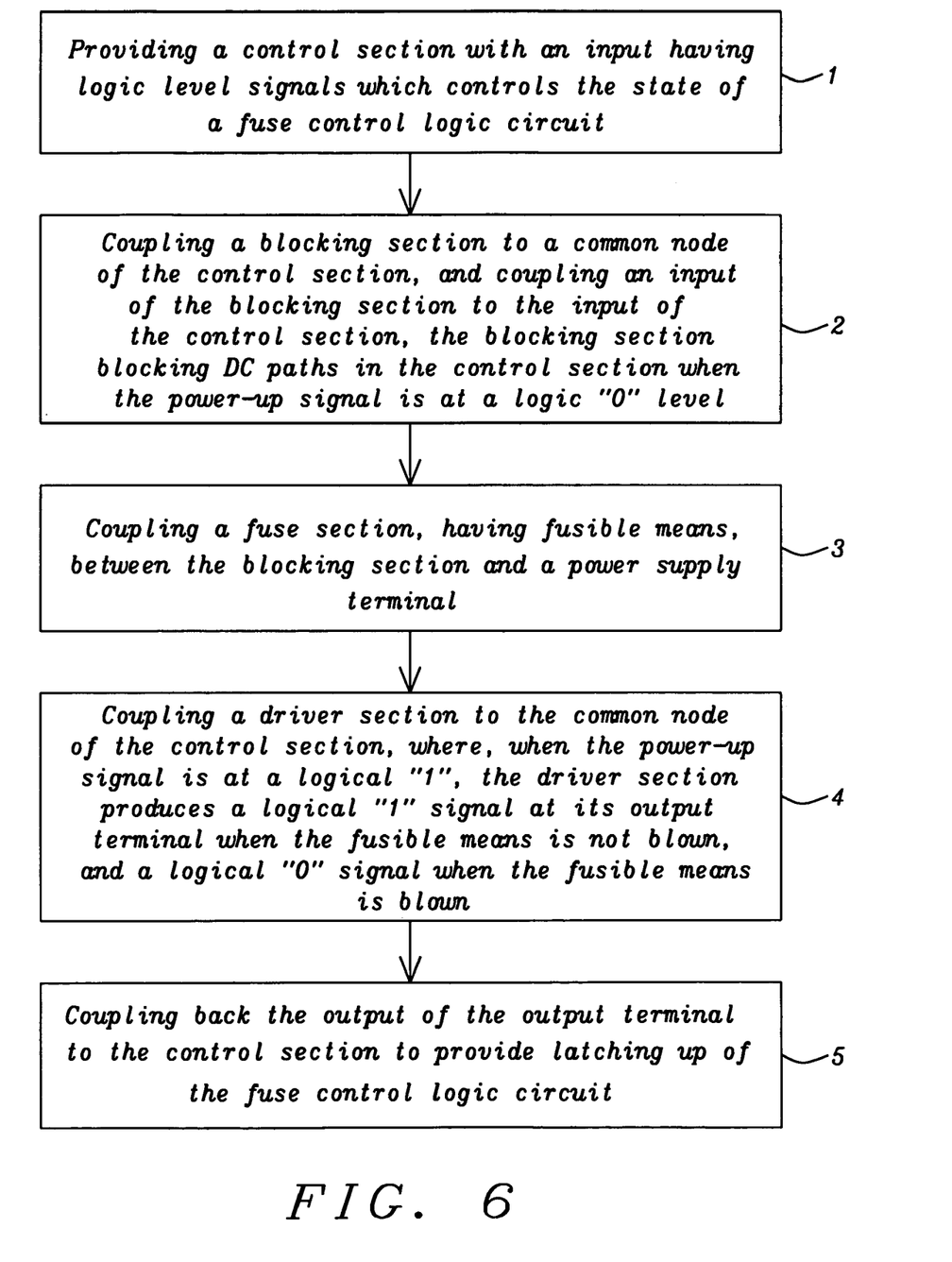
FIG. 6 is a block diagram of the preferred method of the present invention.

Referring now to the block diagram of FIG. 6 we describe the preferred method of the present invention:

BLOCK 1 provides a control section with an input, having logic level signals, which controls the state of a fuse control logic circuit.

BLOCK 2 couples a blocking section to a common node of the control section, and an input of the blocking section to the input of the control section, where the blocking section blocks DC paths in the control section when the power-up signal is at a logical "0".

BLOCK 3 couples a fuse section having fusible means, between the blocking section and a power supply terminal.

BLOCK 4 couples a driver section to the common node of the control section, where, when the power-up signal is at a logical "1", the driver section produces a logical "1" signal at its output terminal when the fusible means is not blown, and a logical "0" signal when the fusible means is blown.

BLOCK 5 couples back the output of the output terminal to the control section to provide latching up of the fuse control logic circuit.

One application of the present invention is when a memory has a bad cell then its address is stored using the fuse control logic circuit. Because the fusible means I1 is then blown the output terminal OUT=logical "0". Conversely, when a memory does not have a bad cell in a certain address then the associated fusible means I1 is not blown and the output terminal OUT=logical "1". The operation is as follows:

When applied to a memory chip, the corresponding fail address of the chip is known after the chip probe test. Then using a laser to blow fuses of a set of fuse control logic circuits, the corresponding fail address will be recorded in the set of fuse control logic circuits. E.g., if the failing address is A3=0, A2=1, A1=1, A0=0, four fuse control logic circuits are involved. The fuses corresponding to A3 and A0 will be blown and will generate the corresponding fail address logic output from the set of 4 fuse control logic circuits. During chip operation, the external address will be compared to the output of the sets of fuse control logic circuits. If the address matches, the redundant cells will substitute for the cells of the corresponding failed address.

This circuit can also be used to advantage for certain functions, e.g., on a die per customer request or for timing options, such as adjustment of timing parameters.

While the invention has been particularly shown and described with reference to the preferred embodiments thereof, it will be understood by those skilled in the art that various changes in form and details may be made without departing from the spirit and scope of the invention.

What is claimed is:

1. A low power fuse control logic circuit, comprising:
   a control section having a first and a second input and a common node, said first input receiving a power-up signal having a logical "0" or "1", said first input coupled to the control gate of a first switching means, said second input coupled to the control gate of a second switching means, where first terminals of said first and said switching means are coupled to a positive terminal of a power supply, where the second terminals of said first and said second switching means are tied to said common node, where said control section controls the state of said fuse control logic circuit as a function of said first input, and where the width-to-length ratio of said second switching means versus said first switching means ranges from 20:1 to 5:1;
   a blocking section with a third switching means, said third switching means having first and second terminals and a control gate, where said first terminal of said third switching means is coupled to said common node, said control gate of said third switching means coupled to said first input of said control section, where said blocking section blocks DC paths in said control section during a power-up sequence, and where the width-to-length ratio of said third switching means versus said second switching means ranges from 10:1 to 2:1;
   a fuse section comprising fusible means, one end of said fusible means coupled to said second terminal of said third switching means, the other end of said fusible means coupled to a return terminal of said power supply, said fuse section controlling the voltage level at said second terminal of said blocking section; and
   a driver section having an input and an output terminal, said driver section comprising inverting means coupled between said common node and said output terminal of said driver section, said driver section coupled further to said control gate of said second switching means, said output terminal of said driver section signaling the state of said fuse control logic circuit.

2. The circuit of claim 1, wherein said third switching means is of opposite conductivity type to said first switching means.

3. The circuit of claim 1, wherein when said power-up signal is at logical "0", said output terminal of said driver section is forced to logical "0" regardless of the state of said fusible means.

4. The circuit of claim 1, wherein, when said power-up signal is at logical "1", said output terminal of said driver section is forced to logical "0" when said fusible means is blown.

5. The circuit of claim 1, wherein, when said power-up signal is at logical "1", said output terminal of said driver section is forced to logical "1" when said fusible means is not blown.

6. The circuit of claim 1, wherein, when said power-up signal is at logical "1", said output terminal of said driver section is forced to logical "0" when said fusible means is not fully blown.

7. A low power fuse control logic circuit, comprising:
   a control section having a first and a second input and a common node, said first input receiving a power-up signal having a logical "0" or "1", said first input coupled to the control gate of a first switching means, said second input coupled to the control gate of a second switching means, where first terminals of said first and said switching means are coupled to a return terminal of a power supply, where the second terminals of said first and said second switching means are tied to said common node, where said control section controls the state of said fuse control logic circuit as a function of said first input, and where the width-to-length ratio of said second switching means versus said first switching means ranges from 20:1 to 5:1;
   a blocking section with a third switching means, said third switching means having first and second terminals and a control gate, where said first terminal of said third switching means is coupled to said common node, said control gate of said third switching means coupled to said first input of said control section, where said blocking section blocks DC paths in said control section during a power-up sequence, and where the width-to-length ratio of said third switching means versus said second switching means ranges from 20:1 to 4:1;
   a fuse section comprising fusible means, one end of said fusible means coupled to said second terminal of said third switching means, the other end of said fusible means coupled to a positive terminal of said power supply, said fuse section controlling the voltage level at said second terminal of said blocking section; and
   a driver section having an input and an output terminal, said driver section comprising inverting means coupled between said common node and said output terminal of said driver section, said driver section coupled further to said control gate of said second switching means, said output terminal of said driver section signaling the state of said fuse control logic circuit.

8. The circuit of claim 7, wherein said third switching means is of opposite conductivity type to said first switching means.

9. The circuit of claim 7, wherein, when said power-up signal is at logical "0", said output terminal of said driver section is forced to logical "0" regardless of the state of said fusible means.

10. The circuit of claim 7, wherein, when said power-up signal is at logical "1", said output terminal of said driver section is forced to logical "0" when said fusible means is blown.

11. The circuit of claim 7, wherein, when said power-up signal is at logical "1", said output terminal of said driver section is forced to logical "1" when said fusible means is not blown.

12. The circuit of claim 7, wherein, when said power-up signal is at logical "1", said output terminal of said driver section is forced to logical "0" when said fusible means is not fully blown.

* * * * *